United States Patent
Le et al.

(10) Patent No.: US 7,453,302 B2
(45) Date of Patent: Nov. 18, 2008

(54) TEMPERATURE COMPENSATED DELAY SIGNALS

(75) Inventors: Thoai Thai Le, Cary, NC (US); Jung Pill Kim, Cary, NC (US)

(73) Assignee: Infineon Technologies AG, Munich (DE)

( * ) Notice: Subject to any disclaimer, the term of this patent is extended or adjusted under 35 U.S.C. 154(b) by 944 days.

(21) Appl. No.: 10/744,807

(22) Filed: Dec. 23, 2003

(65) Prior Publication Data

US 2005/0135430 A1    Jun. 23, 2005

(51) Int. Cl.
*H03H 11/26*    (2006.01)
(52) U.S. Cl. .................................. 327/262; 327/513
(58) Field of Classification Search ................ 327/262, 327/513, 261, 268, 269, 270, 271
See application file for complete search history.

(56) References Cited

U.S. PATENT DOCUMENTS

| | | | |
|---|---|---|---|
| 4,758,740 A * | 7/1988 | Wilhelm et al. ............. | 327/378 |
| 5,727,021 A | 3/1998 | Truebenbach | |
| 5,805,517 A | 9/1998 | Pon | |
| 6,025,745 A * | 2/2000 | Lee et al. .................... | 327/277 |
| 6,092,030 A | 7/2000 | Lepejian et al. | |
| 6,163,195 A | 12/2000 | Jefferson | |
| 6,377,102 B2 | 4/2002 | Sahu | |
| 6,529,058 B2 | 3/2003 | Gupta | |
| 6,593,789 B2 | 7/2003 | Atallah et al. | |
| 6,633,189 B1 | 10/2003 | Gradinariu et al. | |
| 6,657,889 B1 | 12/2003 | Subramanian et al. | |
| 2002/0133789 A1 | 9/2002 | Hsu et al. | |

FOREIGN PATENT DOCUMENTS

| | | |
|---|---|---|
| DE | 697 13 084 T2 | 3/2003 |
| EP | 0527366 A1 | 7/1992 |
| GB | 2 213 338 A | 8/1989 |
| JP | 10-145198AA | 5/1998 |

* cited by examiner

*Primary Examiner*—Jeffrey S Zweizig
(74) *Attorney, Agent, or Firm*—Dicke, Billig & Czaja, PLLC

(57) ABSTRACT

A temperature compensated delay circuit for delaying a signal within an integrated circuit includes a temperature sensor. The temperature sensor is configured to sense a temperature proximal to the integrated circuit and configured to provide a control signal representative of the sensed temperature proximal to the integrated circuit. A delay chain is configured to receive a signal and provide a plurality of output signals. Each output signal has a time delay distinct from other output signals. A multiplexer is configured to receive the plurality of output signals from the delay chain and to receive the control signal from the temperature sensor representative of the sensed temperature. The multiplexer is configured to provide a temperature compensated delayed output signal.

20 Claims, 8 Drawing Sheets

| 412 | 410 | 408 | | 120 |
|---|---|---|---|---|
| $S_2$ | $S_1$ | $S_0$ | TEMPERATURE | OUTPUT |
| 0 | 0 | 0 | $T \geq 100°C$ | $I_0$ |
| 0 | 0 | 1 | $85°C \leq T < 100°C$ | $I_1$ |
| 0 | 1 | 0 | $70°C \leq T < 85°C$ | $I_2$ |
| 0 | 1 | 1 | $55°C \leq T < 70°C$ | $I_3$ |
| 1 | 0 | 0 | $40°C \leq T < 55°C$ | $I_4$ |
| 1 | 0 | 1 | $25°C \leq T < 40°C$ | $I_5$ |
| 1 | 1 | 0 | $10°C \leq T < 25°C$ | $I_6$ |
| 1 | 1 | 1 | $T < 10°C$ | $I_7$ |

Fig. 9

TEMPERATURE COMPENSATED DELAY SIGNALS

BACKGROUND

The invention relates generally to a delay circuit for delaying a signal within an integrated circuit, and more specifically to a temperature compensated delay path for a signal, the delay path based upon a temperature proximal to the integrated circuit.

A typical integrated circuit includes various components having numerous signals transmitted between components includes data signals, address signals, command signals, control signals, clock signals, read signals, write signals, and select signals. Depending on the application, signals are required to maintain synchronization to ensure proper operation. For example, in some environments, a signal is required to be present at a signal input port prior to a clock transition. Therefore, in one application, an input signal can be provided as an output signal at a clock transition. However, the signal must not arrive at the signal input port too early, such that the input signal will be transitioned as the output signal at a prior and undesired clock transition. Therefore, there is a window of time at which a signal must arrive at the signal input port.

Each signal within an integrated circuit travels from one component to another component via a signal path. Generally, the path of signals other than clock signals is relatively short. On the other hand, a clock signal path tends to be relatively long as it can span from a clock located at one end the integrated circuit to a component located at the other end of the integrated circuit. As a result, the time delay on the clock path tends to be longer than the time delay on other signal paths. Thus, time delays must be built into a signal path prior to the signal reaching the input port of a component so that the signal arrives at the input port in the desired timing window.

The two most recognized and used circuits for delaying a signal is a resister/capacitor (RC) element circuit and an inverter chain. An RC element circuit utilizes a reference source to load and unload an RC element, whose dimensions determine the required timing. A disadvantage to this implementation is the variation in time delay due to temperature dependency. The delay of an RC element circuit varies in different temperature environments.

An inverter chain is a simple serial circuit incorporating various pairs of inverters. Each pair of inverters first inverts the signal, and second inverts the inverted data signal, thereby providing an output signal equal in value to the input signal. However, each inverter introduces a time delay to the signal, thereby producing a time delayed signal. To introduce a minimal time delay, a minimal number of inverter pairs are provided along the signal path. Conversely, to introduce a longer time delay, several inverter pairs are provided along the signal path.

Inverters are commonly designed including complementary metal oxide semiconductors (CMOS) devices, which further include transistors. Transistors are the elements within the inverters that introduce the time delay. Generally, the speed of a transistor has a relatively high inversely proportional dependency on temperature changes within the transistor environment. The speed of the transistor decreases with an increase in the temperature of the transistor, and increases with a decrease in the temperature of the transistor. The temperature dependency factor of an inverter chain is especially critical in low power applications.

Integrated circuits are often subject to an extremely wide range of temperatures based upon specific applications. For example, depending on the application used, an integrated circuit may be subject to temperatures varying in range from −25° C. to 125° C. The time delay of an RC element circuit can be as great as 20% over the extended mobile application temperature range of −25° C. to 125° C. Likewise, the time delay of a simple single inverter pair can be as great as 20% over the extended mobile application temperature range of −25° C. to 125° C. The accumulated delay is even larger when delay components are connected serially.

SUMMARY

A temperature compensated delay circuit for delaying a signal within an integrated circuit includes a temperature sensor. The temperature sensor is configured to sense a temperature proximal to the integrated circuit and configured to provide a control signal representative of the sensed temperature proximal to the integrated circuit. A delay chain is configured to receive signal and provide a plurality of output signals. Each output signal has a time delay distinct from other output signals. A multiplexer is configured to receive the plurality of output signals from the delay chain and to receive the control signal from the temperature sensor representative of the sensed temperature. The multiplexer is configured to provide a temperature compensated delayed output signal.

BRIEF DESCRIPTION OF THE DRAWINGS

FIG. 9 is a table illustrating input and output signals based upon temperatures in accordance with the partial electrical block diagram of FIG. 6.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
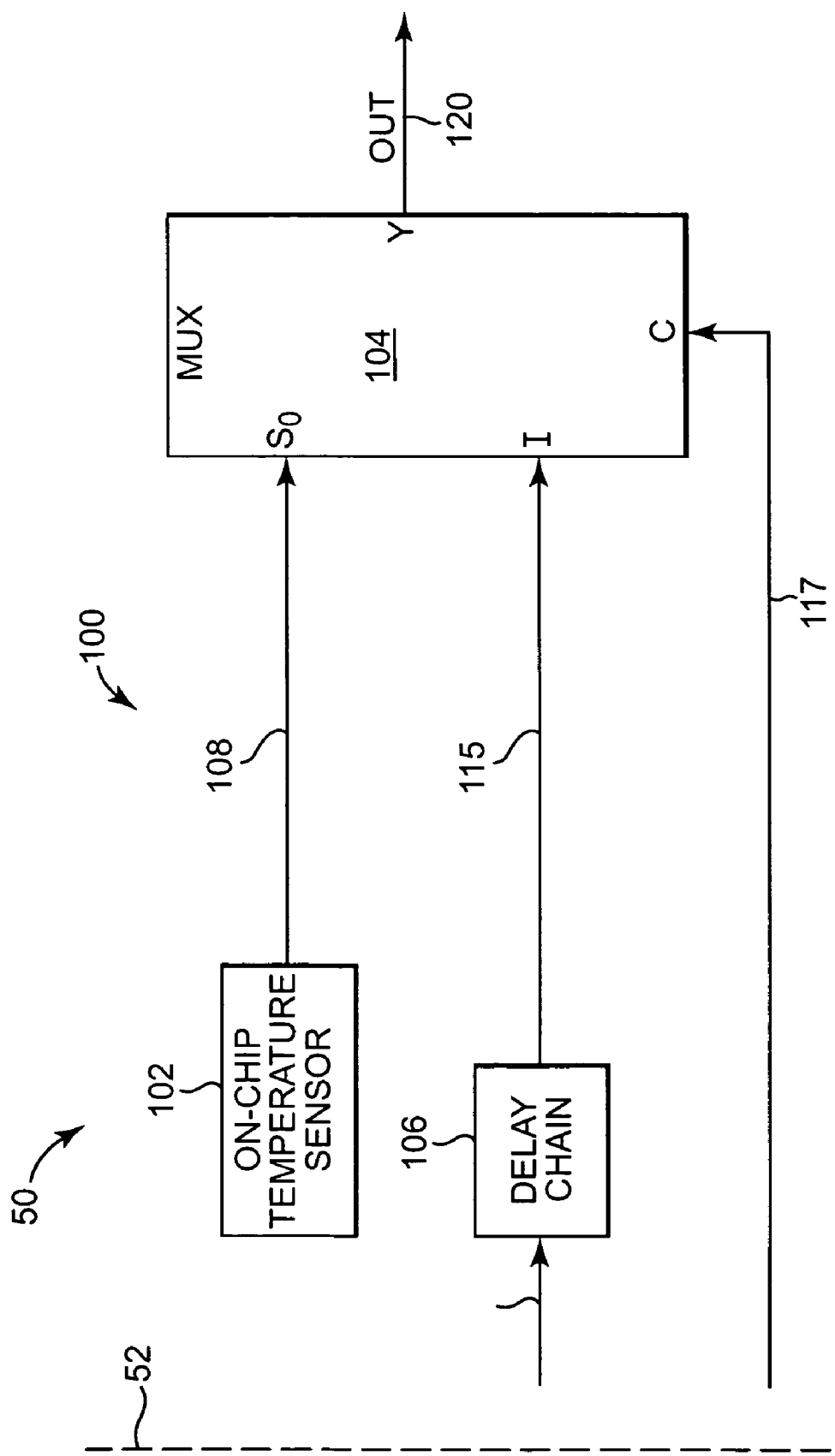
FIG. 1 is a block diagram illustrating a delay circuit in accordance with the present invention.

FIG. 1 is a block diagram illustrating temperature compensated delay circuit 100. Temperature compensated delay circuit 100 provides an output signal equal in value to an input signal; however, the output signal is time delayed to ensure proper synchronization and clocking of desired signals. The delay time of temperature compensated delay circuit 100 remains constant, regardless of the temperature environment in which temperature compensated delay circuit 100 is located. Thus, signals, such as data, address, command, control, clock, read, write, and select signals, are properly synchronized with clocking signals, regardless of temperature variations of the circuit environment.

Generally, temperature compensated delay circuit 100 includes on-chip temperature sensor 102, multiplexer 104, and delay chain 106. In the embodiment shown in FIG. 1, on-chip temperature sensor 102 is positioned on the same chip as other circuitry, such as multiplexer 104 and inverter chain 106. Temperature compensated delay circuit 100 is a sub-component of integrated circuit 50. Other components of integrated circuit 50 are not shown in FIG. 1 for clarity purposes. Similarly, integrated circuit 50 is one of many circuits positioned on chip 52. Chip 52 may incorporate one or more integrated circuits similar to integrated circuit 50.

On-chip temperature sensor 102 is configured to sense a temperature proximal to temperature compensated delay circuit 100. On-chip temperature sensor 102 provides control signal 108 to select input port $S_0$ of multiplexer 104. Control signal 108 may also be called select signal 108 and is representative of the sensed temperature proximal to temperature compensated delay circuit 100, as sensed by on-chip temperature sensor 102.

Delay chain 106 provides a delay for signal 114, such that delayed signal 115 is provided to multiplexer 104 via input I. In one embodiment, delay chain 106 provides several signals 115 which are equal in value to signal 114, however, have a time delay distinct from other output signals.

Multiplexer 104 provides output signal 120 based upon control signal 108. Output signal 120 is equal in value to one of the plurality of signals 115 to multiplexer 104 incorporating a proper and desired time delay such that signal 114 will be provided as output signal 120 via output port Y at clock transition of clock signal 117 received at clock input port C.

Figure 2:
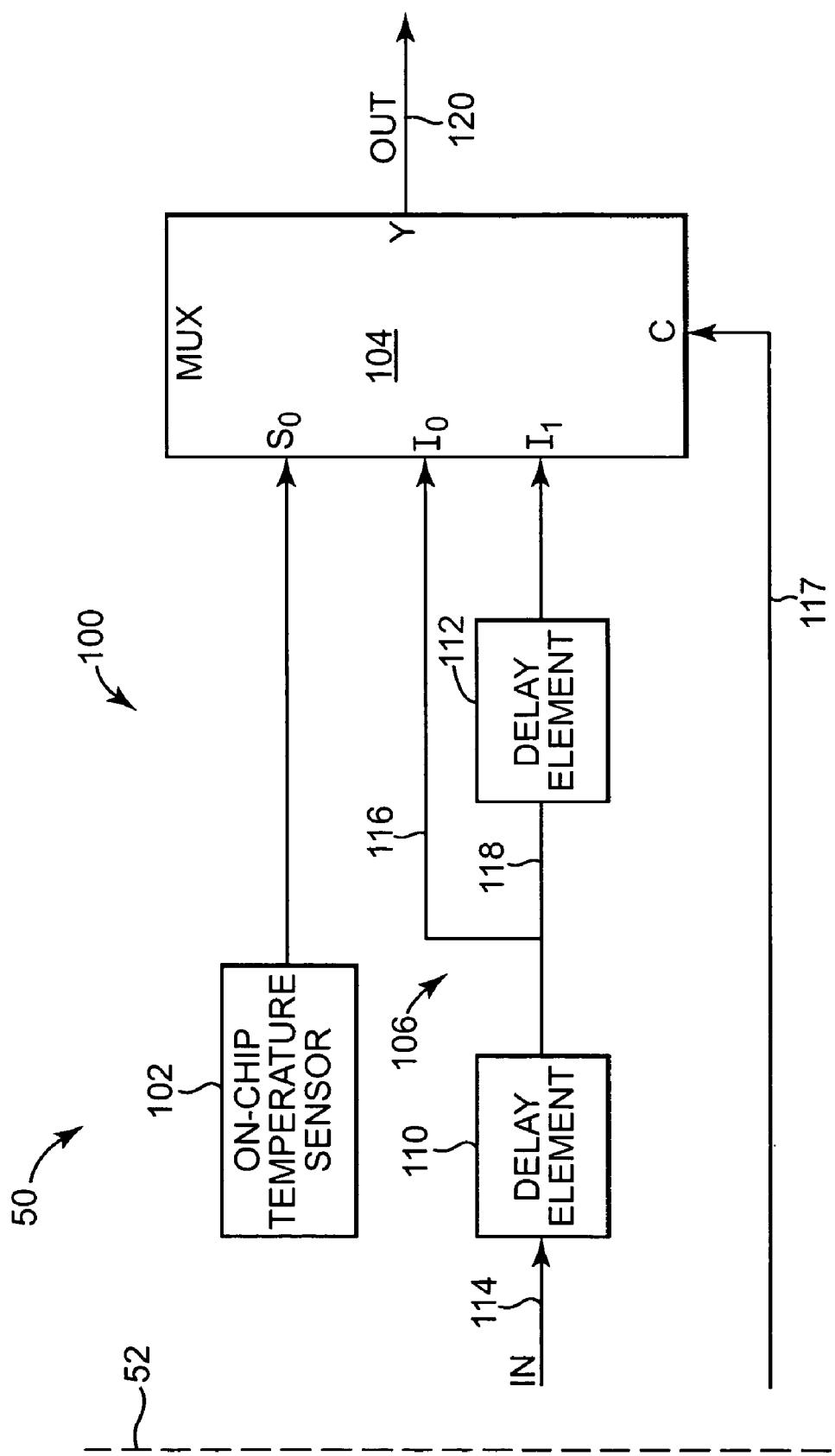
FIG. 2 is a block diagram illustrating a delay circuit in accordance with the present invention.

FIG. 2 is a block diagram illustrating a delay circuit in accordance with the present invention. FIG. 2 illustrates temperature compensated delay circuit 100. Temperature compensated delay circuit 100 includes several identical elements from temperature compensated delay 100 of FIG. 1. Therefore, identical elements have been identified with identical reference numerals.

Delay chain 106 includes delay elements 110 and 112. While only two delay elements are shown in FIG. 1, it is understood that any number of delay elements may be included within delay chain 106, without deviating from the present invention. Two delay elements are shown only for clarity purposes to illustrate two separate delay paths for signal 114 to ensure proper synchronization, regardless of environment temperature. Delay elements 110 and 112 may include, but are not limited to, any one or combination of the following: an inverter delay chain having one or more inverter pairs, an RC delay chain, an inverter and capacitor delay chain, a logic gate delay chain such as a NAND gate or a NOR gate, or a combination thereof.

Signal 114, which represents any one or more of any type of signals used within an integrated circuit, such as data signals, address signals, command signals, control signals, read signals, read signals, clock signals, write signals, and select signals, is provided to delay chain 106. Delay element 110 imposes a time delay upon signal 114. Signal 114 is then provided to two separate paths, path 116 and path 118. Signal 114 is provided to input port $I_0$ of multiplexer 104 via path 116 having no additional delay elements. Signal 114 is also provided to input port $I_1$ of multiplexer 104 via path 118 having an additional delay element 112. As illustrated in FIG. 2, delay element 112 provides an additional time delay to signal 114 prior to transmitting signal 114 to input port $I_1$.

Delay elements 110 and 112 may include one or more of various known delay elements or chains. For example, delay elements 110 and 112 may each comprise one or more of the following: an inverter pair or a plurality of inverter pairs, an RC delay chain or a plurality of RC delay chains, a combination of inverter and capacitor chains, a logic gate delay including NAND/NOR logic gates, or a combination of one or more of the previously listed delay elements or chains.

As shown in FIG. 2, signal 114 is provided to multiplexer 104 having two distinct time delays via paths 116 and 118. Therefore, output 120 of multiplexer 104 is equal to one of the signals inputted to input signal $I_0$ and $I_1$ of multiplexer 104 based upon the temperature sensed by on-chip temperature sensor 102 in order to provide proper synchronization.

Figures 3, 4:
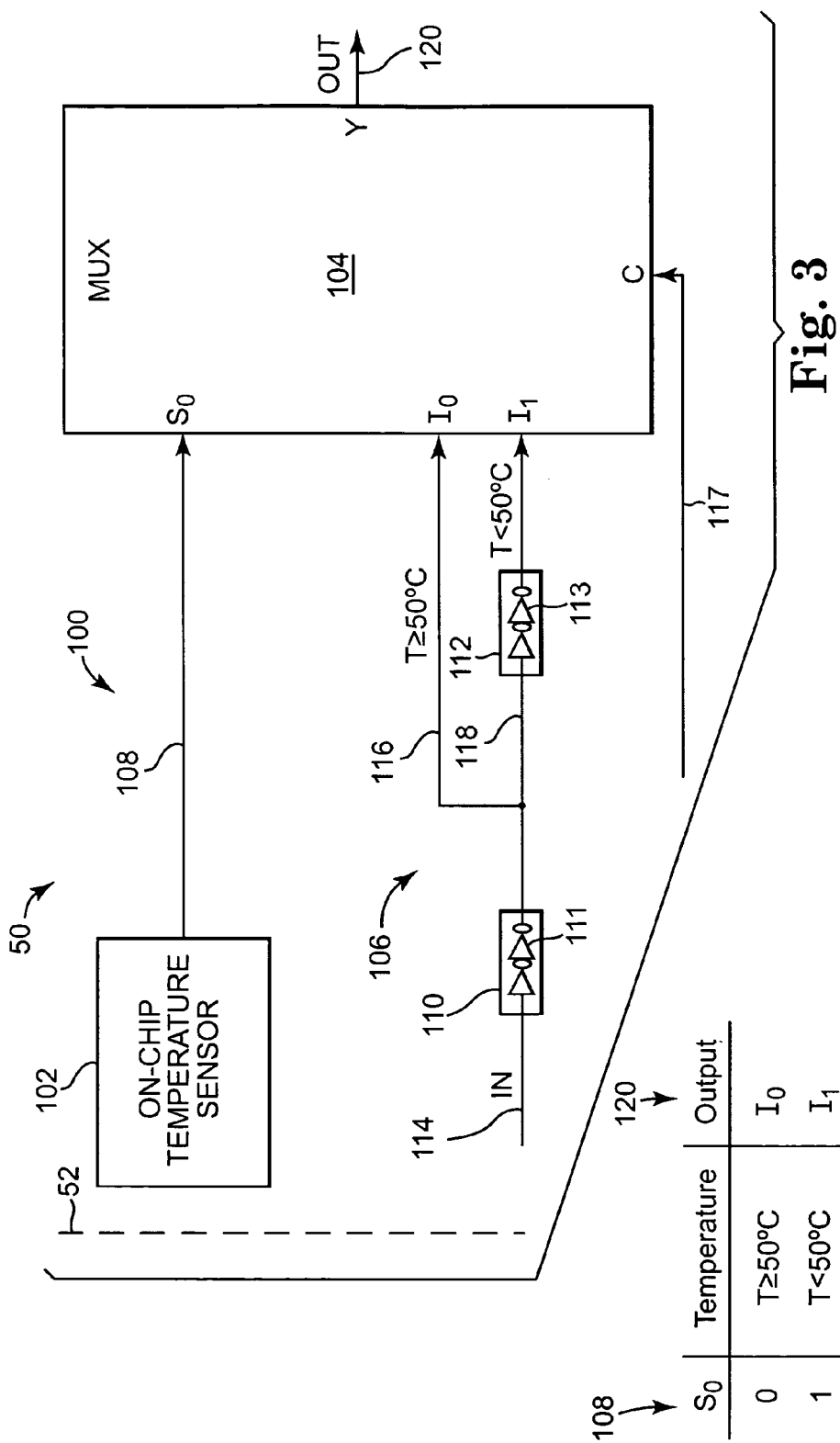
FIG. 3 is a partial electrical block diagram illustrating a delay circuit in accordance with the present invention.
FIG. 4 is a table illustrating input and output signals based upon temperatures in accordance with the partial electrical block diagram of FIG. 1.

FIG. 3 is a partial electrical block diagram illustrating temperature compensated delay circuit 100. Temperature compensated delay circuit 100 includes several identical elements from temperature compensated delay circuit 100 shown in FIG. 2. Therefore, identical elements have been identified with identical reference numerals. As shown in FIG. 3, delay elements 110 and 112 further include inverter pairs 111 and 113, respectively.

Inverters, such as the inverters of inverter pairs 111 and 113, are commonly designed including complimentary metal oxide semiconductors (CMOS) inverters, which further include transistors. The speed of a transistor has a relatively large inversely proportional dependency on temperature changes within the transistor environment. The speed of a particular transistor decreases with an increase in the temperature of the transistor, while the speed of a transistor increases with a decrease in the temperature of the transistor.

Integrated circuits, such as integrated circuit 50, are often subject to an extremely wide range of temperatures based upon the specific application. For example, depending on the application used, an integrated circuit may be subject to temperatures varying in range from −25° C. to 125° C. The time delay of a simple, single inverter pair can be as great as 20% over the extended mobile application temperature range of −25° C. to 125 C. The accumulated delay is even larger when inverted pairs are connected serially in an inverter chain.

Therefore, as shown in FIG. 3, signal 114 is provided to input port $I_0$ via path 116 representing a relatively high temperature sensed by on-chip temperature sensor 102, such as for example purposes only, greater than or equal to 50° C. Conversely, signal 114 is provided to input port $I_1$ via path 118, representing a relatively low temperature sensed by on-chip temperature sensor 102, such as for example purposes only, less than 50° C. A temperature of 50° C. should not be considered limiting. Any temperature value can be utilized depending upon the desired application.

Since the speed of transistors within inverting pairs 111 and 113 are inversely proportional to the temperature proximal to temperature compensated delay circuit 100, signal 114 is transmitted through a minimal number of inverter pairs in association with a higher temperature; as compared to transmitting signal 114 through a larger number of inverter pairs in association with a lower temperature. To further clarify this point, if the temperature proximal to temperature compensated delay circuit 100 would be greater than 50° C., such as 75° C., the speed of the transistors within inverter pair 111 is relatively slow, thereby providing a relatively large time delay to signal 114. Signal 114 proceeds via path 116 to input port $I_0$ of multiplexer 104. The desired time delay on signal 104 would be accomplished via single inverter pair 111. Conversely, at relatively lower temperatures less than 50° C., such as 25° C., signal 114 is transmitted through both inverter pairs 111 and 113, prior to reaching input port $I_1$ of multiplexer 104. Due to the relatively low temperature, the speed of the transistors within inverter pairs 111 and 113 is relatively fast, thereby providing a relatively short time delay on signal 114. However, by increasing the number of inverter pairs through which signal 114 must transmit, the time delay of signal 114 reaching input port $I_1$ at a temperature of less than 50° C. is equal the time delay of signal 114 reaching input port $I_0$ of multiplexer 104 at a temperature greater than 50° C. Once again, the particular temperatures chosen should not be considered limiting with respect to this application. The temperatures described application are only for reference and clarification purposes.

FIG. 4 is a table illustrating possible logic signals of control or selection signals 108 based on the associated temperature ranges. The table of FIG. 4 also illustrates output signal 120 of multiplexer 104 in conjunction with both control signal 108 and the temperature sensed from on-chip temperature sensor 102. On-chip sensor 102 will sense the temperature proximal to temperature compensating delay circuit 100. As shown in the table in FIG. 4, if the temperature as sensed by on-chip temperature sensor 102 is greater than or equal to 50° C., control or select port $S_0$ will receive control or select signal 108 in the form of a logic 0 indicating a temperature of greater than 50° C. Select port 108 equals logic 0 and output signal 120 of multiplexer 104 is equal to signal 114 provided to input port $I_0$ of multiplexer 104. Conversely, if on-chip temperature sensor 102 senses a temperature proximal to temperature compensated delay circuit 100 less than 50° C., control signal 108 provides a signal in the form of a logic 1 to multiplexer 104 such that select signal 108 equals 1. As shown in the table in FIG. 2, if select port 108 equals logic 1, output signal 120 of multiplexer 104 will equal signal 114 provided at input port $I_1$ of multiplexer 104. The logic values are shown for illustrative purposes only, and should not be considered limiting.

It is understood in the art that while inverter pair 111 and inverter pair 113 are each shown as a single inverter pair, each inverter pair may represent one or more inverter pairs depending upon the desired application. Also, the selected temperature of 50° C. should only be a reference point and should not be considered limiting. Depending upon the application, any temperature may be interchanged with 50° C. without varying from the present invention. In addition, in one embodiment, signal 114 represents one of a number of signal types, such as data, address, command, control, clock, read, write, select, or any other signal type within an integrated circuit. Similarly, output signal 120 represents the same signal type equal in value to signal 114, but appropriately time delayed in order to ensure synchronous and desired timing.

Figure 5:
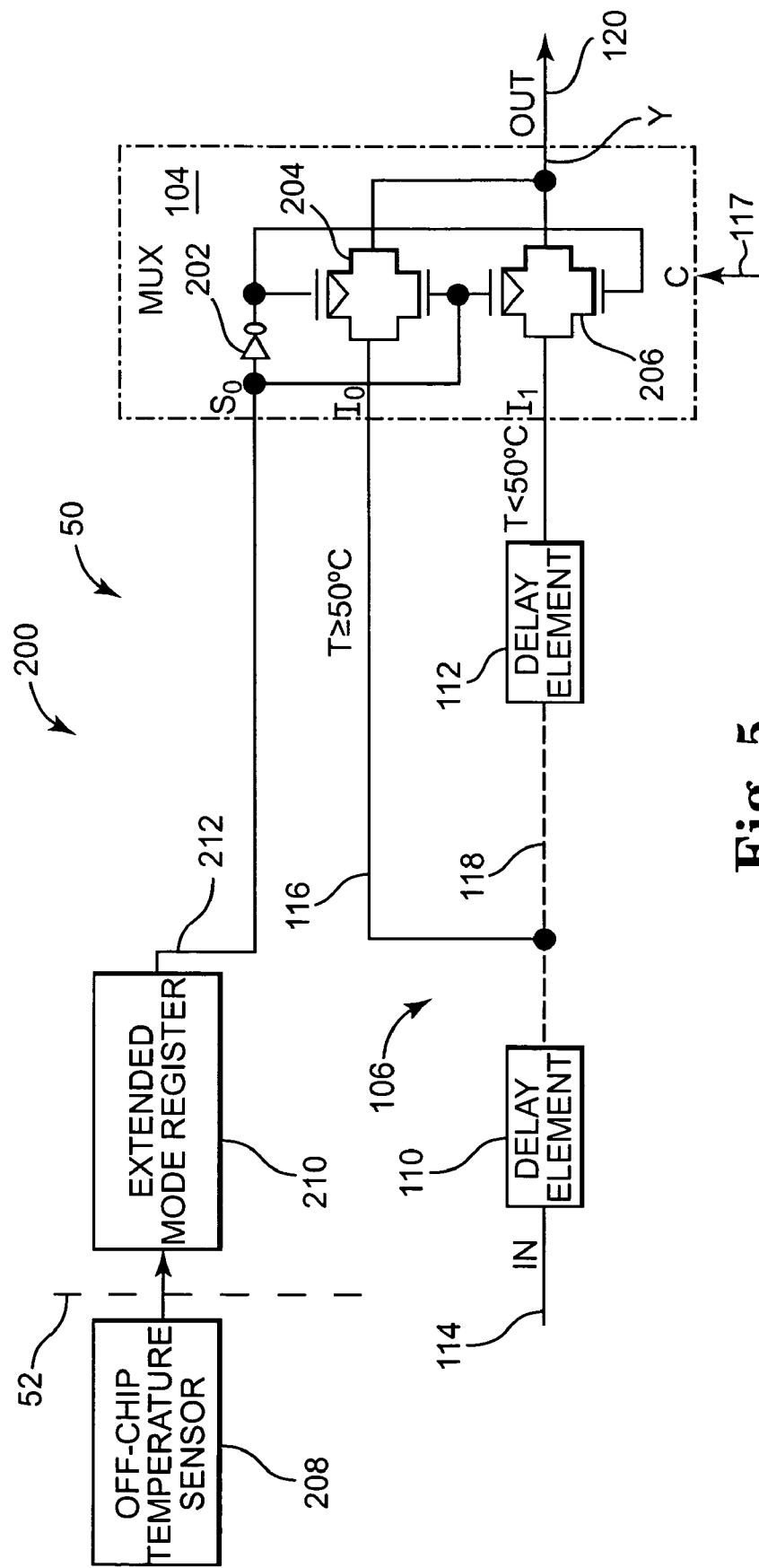
FIG. 5 is a partial electrical block diagram illustrating another embodiment of a delay circuit in accordance with the present invention.

FIG. 5 illustrates another embodiment of the present invention. In particular, FIG. 5 illustrates temperature compensated delay 200. Temperature compensated delay circuit 200 includes several identical elements from temperature compensated delay circuit 100. Therefore, identical elements have been identified with identical reference numerals. Temperature compensated delay circuit 200 includes multiplexer 104 having select input port $S_0$ and input ports $I_0$ and $I_1$.

Additionally, as shown in FIG. 5, multiplexer 104 includes inverter 202 and selectors 204 and 206. Inverter 202 and selectors 204 and 206 are also part of multiplexer 104 as shown in FIGS. 1, 2 and 3, however, have not been shown in those figures for clarity purposes. Temperature compensated delay circuit 200 also includes delay chain 106 having delay elements 110 and 112 and paths 116 and 118 for signal 114. Delay elements 110 and 112 may include, but are not limited to, any one or combination of the following: an inverter delay chain having one or more inverter pairs, an RC delay chain, an inverter and capacitor delay chain, a logic gate delay chain such as a NAND gate or a NOR gate, or a combination thereof. Temperature compensated delay circuit 200 further includes off-chip temperature sensor 208 and extended mode register 210.

Off-chip temperature sensor 208 and extended mode register 210 together provide the same functionality as on-chip temperature sensor 102 of FIG. 1. Off-chip temperature sensor 208 senses a temperature proximate to temperature compensated delay circuit 200. However, off-chip temperature sensor 208 is located distinct from integrated circuit 50 and chip 52. Control or select signal 212 is provided from off-chip temperature sensor 208 to extended mode register 210 indicative of the temperature sensed by off-chip temperature sensor 208. Extended mode register 210 receives a signal representative of the temperature sensed by off-chip temperature sensor 208 and provides control or select signal 212 to select port $S_0$ of multiplexer 104.

Multiplexer 104 is a standard one-bit multiplexer having two input lines and one output line. Inverter 202 of multiplexer 104 inverts selected signal 108 received at input port $S_0$, which is then provided to both selectors 204 and 206. Likewise, uninverted select signal 108 is provided to both selectors 204 and 206. As previously shown and discussed with reference to FIG. 3, input port $I_0$ will receive signal 114 via path 116, representative of signal 114 time delayed by delay element 110. Likewise, input port $I_1$ will receive signal 114 via path 118 and time delayed by delay elements 110 and 112. Similar to that of FIG. 3, output signal 120 of multiplexer 104 will represent a desired time delay signal equal in value to signal 114.

The location of a temperature sensor, whether being on-chip temperature sensor 102 or off-chip temperature sensor 208, does not effect the desired outcome of the present circuit. In addition, and as discussed with reference to FIG. 3, the temperature ranges shown and described with respect to FIG. 5, greater or equal to 50° C. and less than 50° C., should not be considered limiting. Depending upon the desired application, any temperature may be chosen without deviating from the present invention.

Figure 6:
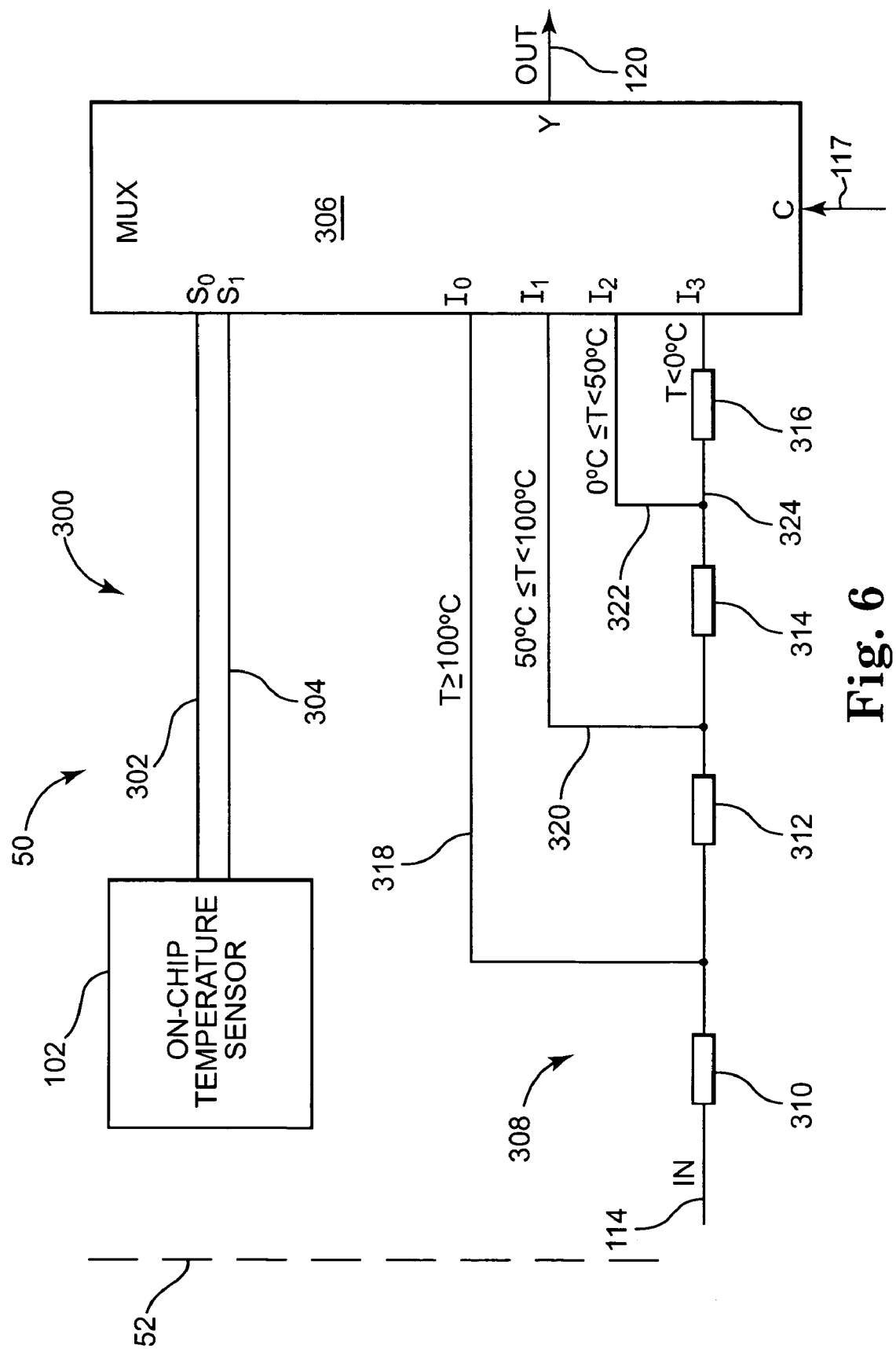
FIG. 6 is a block diagram illustrating another embodiment of a delay circuit in accordance with the present invention.

FIG. 6 is a block diagram illustrating temperature compensated delay circuit 300 in accordance with the present invention. Elements of temperature compensated delay circuit 300 of FIG. 6 which are identical to elements of temperature compensated delay circuit 100 of FIG. 3 are labeled with identical reference numerals. Temperature compensated delay circuit 300 differs from temperature compensated delay circuit 200 of FIG. 5 and temperature compensated delay circuit 100 of FIG. 3 in that temperature compensated delay circuit 300 includes a two-bit temperature sensor output. In particular, temperature information can be transmitted from on-chip temperature sensor 102 to select port $S_0$ and select port $S_1$ via control or select signals 302 and 304.

Multiplexer 306 is a two-bit multiplexer having four input lines and one output line. Multiplexer 306 includes input ports $I_0$, $I_1$, $I_2$, and $I_3$, control or select ports $S_0$ and $S_1$, and output port Y. Delay chain 308 includes delay elements 310, 312, 314, and 316, and paths 318, 320, 322, and 324.

Temperature compensated delay circuit 300 operates in a similar fashion to that described with reference to temperature compensated delay circuit 100 and temperature compensated delay circuit 200. For example, on-chip temperature sensor 102, positioned on integrated circuit 50 and chip 52, sensors a temperature proximal to temperature compensated delay circuit 300. Signals related to the temperature sensed by on-chip temperature sensor 102 are supplied to select ports $S_0$ and $S_1$ via control or select signals 302 and 304. In the embodiment shown in FIG. 6, temperature compensated delay circuit 300 is capable of providing control or select signals 302 and 304 indicating whether the temperature sensed by on-chip temperature sensor 102 falls within one of four temperature categories. Control or select signals 302 and 304 are signals indicative of which one of four temperature categories the temperature sensed by on-chip temperature sensor 102 falls within.

Figure 7:
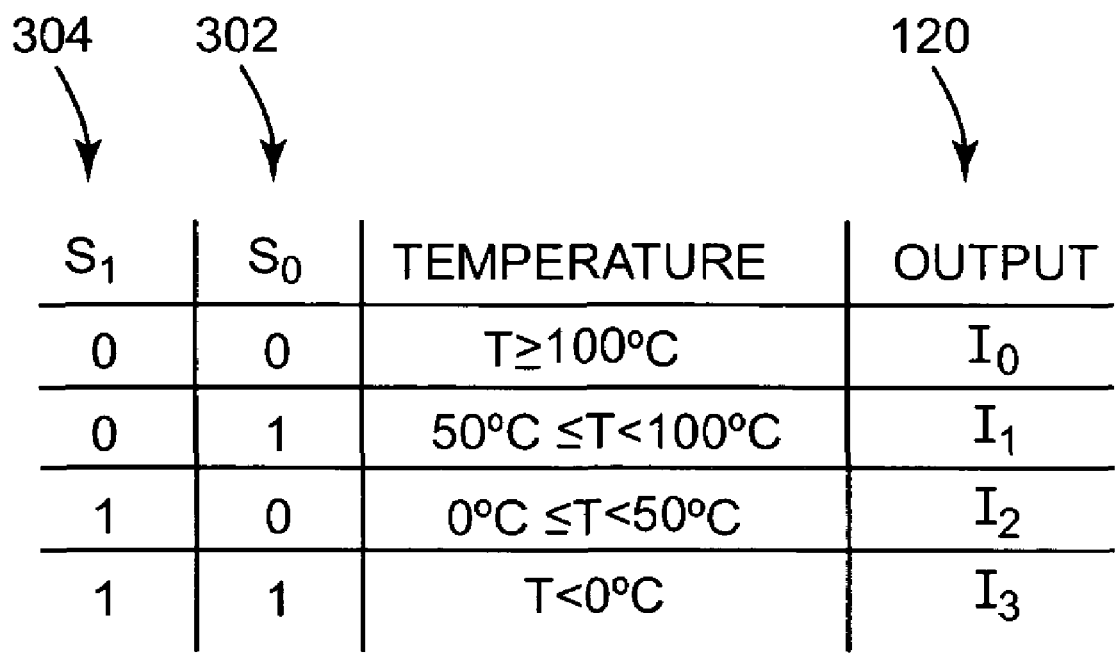
FIG. 7 is a table illustrating input and output signals based upon temperatures in accordance with the partial electrical block diagram of FIG. 4.

FIG. 7 is a table illustrating the four temperature ranges and the associated select signals and output signal 120. For illustrative purposes only, the four temperature ranges are: 1) a temperature greater than or equal to 100° C.; 2) a temperature less than 100° C., but greater than or equal to 50° C.; 3) a temperature less than 50° C., but greater than or equal to 0° C.; and 4) a temperature less than 0° C.

When on-chip temperature sensor 102 senses a temperature greater than or equal to 100° C., control or select signals 302 and 304 provided a logic 0 and a logic 0, respectively, to input ports $S_0$ and $S_1$ of multiplexer 306. With both select signals equal to logic 0, the output of multiplexer 120 is equal to signal 114 as provided to multiplexer via path 318 and input port $I_0$. With temperatures greater than or equal to 100° C., delay element 310 will provide the necessary and desired delay of signal 114. Similarly, when on-chip temperature sensor 102 senses a temperature less than 100° C., but greater than or equal to 50° C., select signal 302 provided to select port $S_0$ will equal logic 1, while select signal 304 provided to select port $S_1$ will equal logic 0. As shown in FIG. 7, with select port $S_0$ equal to logic 1 and select port $S_1$ equal to logic 0, output 120 of multiplexer 306 will equal signal 114 as provided to input port $I_1$ via path 320. In this circumstance, with the temperature sensed by on-chip temperature sensor 102 being less than 100° C., but greater or equal to 50° C., delay elements 310 and 312 will provide the necessary and desired time delay of signal 114.

When on-chip temperature sensor 102 senses a temperature less than 50° C, but greater than or equal to 0° C., select signal 302 will provide a signal equal to logic 0, while select signal 304 will provide a signal to select port $S_1$ equal to logic 1. In this circumstance, output 120 of multiplexer 306 will be equal to signal 114 at input port $I_2$ as provided by path 322. In this circumstance, where the temperature sensed by on-chip temperature sensor 102 is less than 50° C. and greater than or equal to 0° C., delay elements 310, 312, and 314 will provide the necessary and desired time delay of signal 114. Similarly, when on-chip temperature sensor 102 senses a temperature less than 0° C., both select signals 302 and 304 will provide a logic signal to select ports $S_0$ and $S_1$, respectively, equal to logic 1. In this circumstance, output 120 of multiplexer 306 will be equal to signal 114 as supplied to input port $I_3$ of multiplexer 306 via path 324. With a sensed temperature less than 0° C., delay elements 310, 312, 314, and 316 will be operating relatively fast. Therefore, it is necessary that signal 114 is transmitted through several inverter pairs to provide the desired and necessary time delay.

Regardless of the temperature sensed, a time delay of signal 114 should be approximately constant. Therefore, temperature compensated delay circuit 300 provides a relatively constant delay period for signal 114, regardless of the sensed temperature, thereby ensuring proper synchronization of signals.

Figure 8:
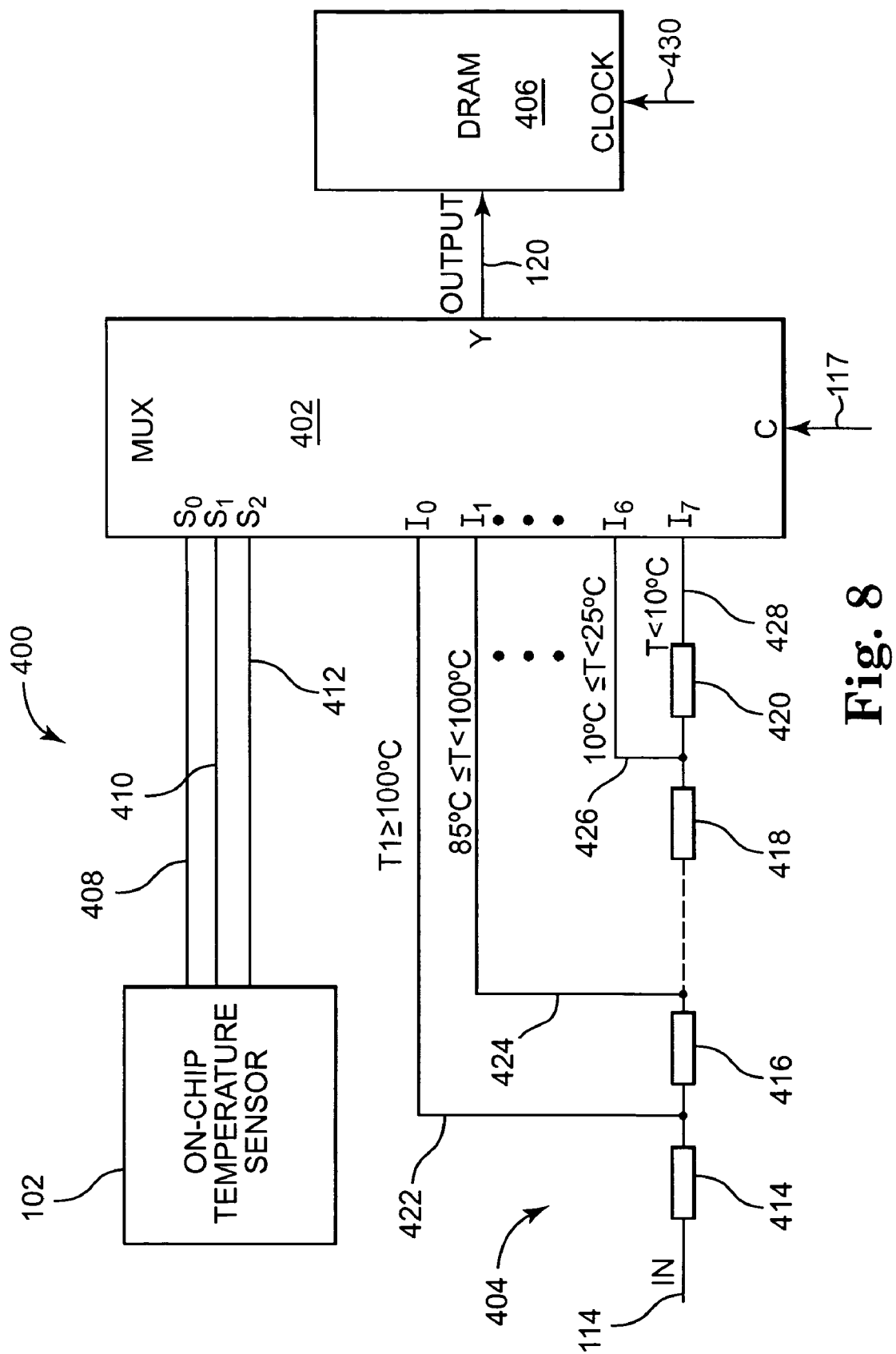
FIG. 8 is a block diagram illustrating another embodiment of a delay circuit in accordance with the present invention.

FIG. 8 is a block diagram illustrating temperature compensated delay circuit 400. Temperature compensated delay circuit 400 includes several identical elements as that of temperature compensated delay circuit 100 of FIG. 3. Therefore, identical elements have been labeled with identical reference numerals. Temperature compensated delay circuit 400 includes on-chip temperature sensor 102, multiplexer 402, inverter chain 404, and dynamic random access memory (DRAM) 406. Temperature compensated delay circuit 400 also includes control or select signals 408, 410, and 412, delay elements 414, 416, 418, and 420, and paths 422, 424, 426, and 428. Four additional delay elements and four additional paths have been removed from FIG. 8 for clarity purposes. However, these four delay elements and paths would be positioned between path 424 and delay elements 418, and connected to input ports $I_2$, $I_3$, $I_4$, and $I_5$, respectively, in a similar fashion to shown delay elements and paths.

In operation, signal 114 is provided to multiplexer 402 via eight separate and distinct paths, each path including separate and distinct number of delay elements. Each path is associated with a separate and distinct temperature range, as sensed by on-chip temperature sensor 102. The temperature sensed by on-chip temperature sensor 102 is provided to multiplexer 402 via control signals 408, 410, and 412. In the embodiment shown in FIG. 8, multiplexer 402 represents a three-bit multiplexer having eight input lines and one output line. As partially shown in FIG. 8, and shown in the table of FIG. 9, eight different temperature ranges are provided, with the associated logic control signals and selected signal provided as the output signal. Output 120 of multiplexer 402 is equal in value to signal 114 and supplied by one of eight inputs $I_0$-$I_7$, depending on the temperature sensed by on-chip temperature sensor 102. In this example, most paths for signal 114 are utilized for a 15° C. temperature range. Once again, these temperature ranges should not be considered limiting but are used for example purposes only. In addition, the number of temperature ranges also should not be considered limiting, but are used for example purposes only.

Similar to previously described, and with reference to FIGS. 3, 5, and 6, a path for signal 114 to multiplexer 402 at higher temperatures includes a minimal number of delay elements. Conversely, as the temperature sensed by temperature sensor 102 decreases, the path of signal 114 to multiplexer 402 includes additional delay elements. Thus, the number of delay elements through which signal 114 must transmit through is inversely proportional to the temperature sensed by on-chip temperature sensor 102. The time delay on each path at associated temperatures is approximately equal to all other paths and associated temperatures.

In one embodiment, output 120 from output port Y of multiplexer 402 is provided as an input signal to dynamic random access memory (DRAM) 406. DRAM 406 typically includes millions or billions of individual DRAM memory cells arranged in an array, with each cell storing information in the form of one bit (i.e., a logic 1 or a logic 0) of data. The memory cells are arranged in a matrix of addressable rows and columns with each row corresponding to a cellblock containing a multi-bit word of data.

In the embodiment shown in FIG. 8, temperature compensated delay circuit 400 synchronizes output signal 120 via clocking signal 430 provided to of DRAM 406. Temperature compensated delay circuit 400 ensures that output signal 120, which in one embodiment is one of a number of signal types, such as data, address, command, control, read, write, select, or any other signal type within an integrated circuit, is synchronized with a clock signal provided to DRAM 406 such that output signal 120 is properly stored in the correct memory cell of DRAM 406 at the proper and desired time.

While the embodiments shown and described with reference to FIGS. 1-7 include specific numbers of input paths, select signal lines, and inverters, it is understood that any number of input paths, select signals and inverters may be used without deviating from the present invention. It is also understood that additional input paths provide more precise delay times to ensure proper synchronization of signals.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A temperature compensated delay circuit for delaying a signal within an integrated circuit, the delay circuit comprising:
    a temperature sensor configured to sense a temperature proximal to the integrated circuit and configured to provide a control signal representative of the sensed temperature proximal to the integrated circuit;
    a delay chain configured to receive a signal and provide a plurality of output signals, each output signal having a time delay distinct from other output signals;
    a multiplexer configured to receive the plurality of output signals from the delay chain and receive the control signal from the temperature sensor representative of the sense temperature, the multiplexer also configured to provide a temperature compensated delayed output signal; and
    a dynamic random access memory configured to receive the temperature compensated delayed output signal.

2. The delay circuit of claim 1, wherein the temperature compensated delayed output signal is equal to one of the plurality of output signals from the delay chain.

3. The delay circuit of claim 1, wherein the temperature sensor further comprises:
    an on-chip temperature sensor located on a chip which also incorporates the integrated circuit.

4. The delay circuit of claim 1, wherein the temperature sensor further comprises:
    an off-chip temperature sensor located distinct from a chip incorporating the integrated circuit.

5. The delay circuit of claim 1, wherein the multiplexer is configured to receive at least one control signal from the temperature sensor, each combination of the control signals representative of a distinct temperature range.

6. The delay circuit of claim 5, wherein the temperature compensated delayed output signal of the multiplexer is determined by a distinct combination of the control signals.

7. The delay circuit of claim 1, wherein the signal input to the delay chain is a data input signal and wherein the temperature compensated delayed output signal of the multiplexer is a temperature compensated delayed data signal equal in value to the data input signal.

8. The delay circuit of claim 1, wherein the signal input to the delay chain is an address signal and wherein the temperature compensated delayed output signal of the multiplexer is a temperature compensated delay address signal equal in value to the address signal.

9. The delay circuit of claim 1, wherein the signal input to the delay chain is a command signal and wherein the temperature compensated delayed output signal of the multiplexer is a temperature compensated delayed command signal equal in value to the command signal.

10. The delay circuit of claim 1, wherein the input signal of the delay chain is a control signal and wherein the temperature compensated delayed output signal of the multiplexer is a temperature compensated delayed control signal equal in value to the control signal.

11. The delay circuit of claim 1, wherein the delay chain further comprises:
    a resistor/capacitor delay chain.

12. The delay circuit of claim 1, wherein the delay chain further comprises:
    a NAND/NOR gate combination delay chain.

13. The delay circuit of claim 1, wherein the delay chain farther comprises:
    at least one inverter pair.

14. The delay circuit of claim 13, wherein each inverter pair of the delay chain further comprises:
    a first inverter configured to provide a time delayed inverted output signal based upon a received input signal; and
    a second inverter configured to receive the inverted output signal of the first inverter, to invert the inverted output signal of the first inverter, and to provide a time delayed output signal.

15. A method for compensating for temperature effects on a delay circuit within an integrated circuit, the method comprising:
    sensing a temperature proximal to the integrated circuit;
    providing a control signal representative of a distinct temperature range incorporating the sensed temperature proximal to the integrated circuit;
    providing a plurality of signals, each signal having a time delay distinct from other signals;
    providing a temperature compensated delayed output data signal based upon the control signal, the temperature compensated delayed output data signal equal to one of the plurality of signals; and
    providing the temperature compensated delayed output signal to a dynamic random access memory.

16. The method of claim 15, wherein the step of sensing a temperature further comprises:
    sensing a temperature proximal to the integrated circuit via a temperature sensor positioned on a chip incorporating the integrated circuit.

17. The method of claim 15, wherein the step of sensing a temperature further comprises:
    sensing a temperature proximal to the integrated circuit via a temperature sensor located distinct from a chip incorporating the integrated circuit.

18. The method of claim 15, wherein the step of providing a control signal further comprises:
    providing a plurality of control signals, each combination of the control signals representative of a distinct temperature range.

19. The method of claim 18, wherein the step of providing a temperature compensated delayed output data signal further comprises:
  determining a combination of the control signals representative of the distinct temperature range incorporating the sensed temperature proximal to the integrated circuit; and
  selecting the temperature compensated delayed output data signal based upon the determined combination of the control signals.

20. The method of claim 15, and further comprising:
  providing an initial signal; and
  generating the plurality of signals having distinct time delays, each of the plurality of signals having a value equal to a value of the initial signal.

* * * * *